United States Patent
Yeong et al.

(10) Patent No.: US 8,153,537 B1
(45) Date of Patent: Apr. 10, 2012

(54) METHOD FOR FABRICATING SEMICONDUCTOR DEVICES USING STRESS ENGINEERING

(75) Inventors: Sai Hooi Yeong, Singapore (SG); Tao Wang, Singapore (SG); Shesh Mani Pandey, Singapore (SG); Chia Ching Yeo, Singapore (SG); Ying Keung Leung, Singapore (SG); Elgin Kiok Boone Quek, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/236,627

(22) Filed: Sep. 19, 2011

Related U.S. Application Data

(63) Continuation-in-part of application No. 12/510,276, filed on Jul. 28, 2009, which is a continuation of application No. 11/940,326, filed on Nov. 15, 2007, now Pat. No. 7,592,270, which is a continuation of application No. 11/304,412, filed on Dec. 15, 2005, now abandoned.

(51) Int. Cl.
*H01L 21/469* (2006.01)
*H01L 21/31* (2006.01)
(52) U.S. Cl. ......... 438/778; 438/783; 438/788; 438/791
(58) Field of Classification Search .................. 438/778, 438/783, 788, 791
See application file for complete search history.

(56) References Cited

U.S. PATENT DOCUMENTS

| | | | |
|---|---|---|---|
| 6,159,856 A | 12/2000 | Nagano | |
| 6,573,172 B1 | 6/2003 | En et al. | |
| 6,939,814 B2 | 9/2005 | Chan et al. | |
| 7,144,767 B2 * | 12/2006 | Chidambarrao et al. | 438/236 |
| 7,214,629 B1 | 5/2007 | Luo et al. | |
| 7,232,730 B2 | 6/2007 | Chen et al. | |
| 7,479,465 B2 | 1/2009 | Spencer et al. | |
| 2002/0079547 A1 | 6/2002 | Kobayashi | |
| 2002/0164847 A1 * | 11/2002 | Kim et al. | 438/199 |
| 2003/0104663 A1 | 6/2003 | Visokay et al. | |
| 2003/0139025 A1 | 7/2003 | Lee et al. | |
| 2004/0075148 A1 | 4/2004 | Kumagai et al. | |
| 2004/0253791 A1 | 12/2004 | Sun et al. | |
| 2005/0093078 A1 | 5/2005 | Chan et al. | |
| 2005/0093081 A1 | 5/2005 | Belyansky et al. | |
| 2005/0158937 A1 | 7/2005 | Yang et al. | |
| 2005/0199958 A1 | 9/2005 | Chen et al. | |
| 2005/0255659 A1 | 11/2005 | Wu et al. | |
| 2005/0285202 A1 | 12/2005 | Huang et al. | |
| 2006/0057787 A1 * | 3/2006 | Doris et al. | 438/153 |
| 2006/0252194 A1 | 11/2006 | Lim et al. | |
| 2007/0024321 A1 | 2/2007 | Lin et al. | |

OTHER PUBLICATIONS

Chien-Hao Chen et al., Stress Memorization Technique (SMT) by Selectively Strained-Nitride Capping for Sub-65nm High-Performance Strained-Si Device Application, 2004 Symposium on VLSI Technology Digest of Technical Papers, Jun. 2004, pp. 56-57, 15-17, USA.

* cited by examiner

*Primary Examiner* — Luan C Thai
(74) *Attorney, Agent, or Firm* — Horizon IP Pte Ltd

(57) ABSTRACT

There is provided a method for fabricating a semiconductor device comprising the formation of a first device in the first device region, the first device comprising first diffusion regions. A stressor layer covering the substrate in the first device region and the first device is subsequently formed, the stressor layer having a first stress value. A laser anneal to memorize at least a portion of the first stress value in the first device is carried out followed by an activation anneal after the laser anneal to activate dopants in the first diffusion regions.

12 Claims, 7 Drawing Sheets

METHOD FOR FABRICATING SEMICONDUCTOR DEVICES USING STRESS ENGINEERING

CROSS-REFERENCE TO RELATED APPLICATION

This application is a continuation-in-part of co-pending U.S. application Ser. No. 12/510,276 filed Jul. 28, 2009, which is a continuation of U.S. application Ser. No. 11/940,326 filed Nov. 15, 2007, now issued as U.S. Pat. No. 7,592,270 which is a continuation of U.S. application Ser. No. 11/304,412 filed Dec. 15, 2005, which is now abandoned. These applications are hereby incorporated by reference in their entireties.

TECHNICAL FIELD

The present invention relates to generally to methods for fabricating semiconductor devices, and more particularly to methods for improving carrier mobility in semiconductor devices using stress engineering.

BACKGROUND ART

Integrated circuits (ICs) comprising many tens of thousands of semiconductor devices including field effect transistors (FETs) are a cornerstone of modern microelectronic systems. A common active device within an integrated circuit is the metal-oxide-semiconductor field effect transistor (MOSFET). A MOSFET typically comprises a gate stack composed of a gate electrode and an underlying gate dielectric. The gate stack is formed over a semiconductor substrate with a source and a drain diffusion region formed within the substrate on opposed sides of the gate stack. A channel region is located under the gate dielectric and between the source and drain regions. During operation, the channel region is converted to an "inversion mode" where a conductive path is formed to link the source and drain when a voltage is applied to the gate electrode.

One of the factors influencing the amount of current flow through a MOSFET channel is the mobility of carriers within the channel region. Specifically, an increase in the mobility of carriers in the transistor channel leads to a higher current during operation and correspondingly faster device operation. Therefore, semiconductor device structures and methods of fabrication that lead to increased mobility of carriers in the channel region are desirable.

SUMMARY OF THE INVENTION

The present invention relates to semiconductor devices and in particular, to semiconductor devices that utilize strain engineering.

In accordance with a first aspect of the invention, there is provided a method for fabricating a semiconductor device comprising providing a substrate comprising a first device region, forming a first device in the first device region, the first device comprising first diffusion regions and forming a stressor layer covering the substrate in the first device region and the first device, the stressor layer having a first stress value. A laser anneal is performed to memorize at least a portion of the first stress value in the first device followed by an activation anneal to activate dopants in the first diffusion regions.

These and other objects, along with advantages and features of the present invention herein disclosed, will become apparent through reference to the following description and the accompanying drawings. Furthermore, it is understood that the features of the various embodiments described herein are not mutually exclusive and can exist in various combinations and permutations.

BRIEF DESCRIPTION OF THE DRAWINGS

In the drawings, like reference numbers generally refer to the same parts throughout the different views. Also, the drawings are not necessarily to scale, emphasis instead generally being placed upon illustrating the principles of the invention. In the following description, embodiments of the invention will now be described, by way of example with reference to the drawings of which.

DETAILED DESCRIPTION

The following embodiments are described in sufficient detail to enable those skilled in the art to make and use the invention. It is to be appreciated that other embodiments would be evident based on the present disclosure, and that system, process, or mechanical changes may be made without departing from the scope of the present invention.

FIGS. 1 to 5 are cross-sectional views illustrating process steps for fabricating Metal Oxide Field Effect Transistors (MOSFET) in accordance with one embodiment of the invention. It should be noted, however, that embodiments of the invention are described in the context of fabricating MOSFETs for illustrative purposes only and that the invention may also be applicable to the fabrication of other semiconductor devices such as but not limited to multi-gate transistors, annular gate transistors and high voltage transistors.

Additionally, it is to be understood that a plurality of conventional processes that are well known in the art and not repeated herein, may precede or follow FIGS. 1-5. Moreover, it is to be understood that many modifications, additions, and/or omissions may be made to the below described process without departing from the scope or spirit of the claimed subject matter. For example, the below described process may include fewer, or more steps. Also, it is to be appreciated that the present disclosure need not be limited to the initial semiconductor structure depicted by FIG. 1.

Figure 1:
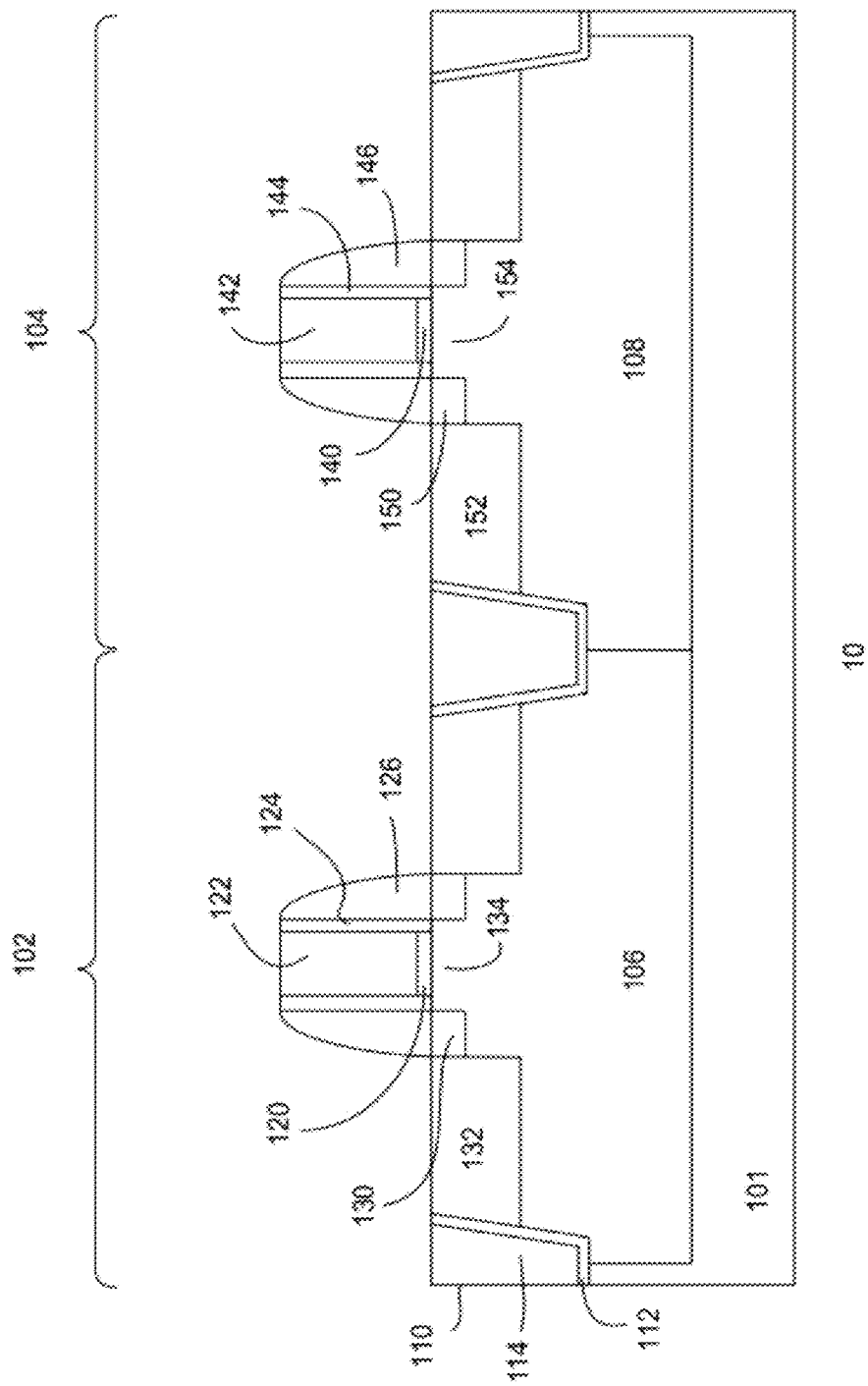
FIGS. 1 to 5 are schematic cross-sectional views illustrating the results of progressive stages in fabricating a semiconductor structure in accordance with a first embodiment of the invention.

Referring now to FIG. 1, therein is shown a semiconductor structure 10 comprising a semiconductor substrate 101 including first and second device regions (102, 104). By way of example, the substrate 101 may include any semiconducting material such as Si, SiC, SiGe, Si/SiGe. In other embodiments, the substrate may also be in the form of a silicon-on-insulator (SOI) configuration comprising a combination of semiconducting material formed above an insulating layer such as silicon dioxide. The substrate may also include one or more crystal orientations (e.g. (100) and/or (110) orientations), which may be strategically employed to enhance the carrier mobility of devices being fabricated.

In FIG. 1, an n-doped MOSFET (NMOS) is formed in the first device region 102 and a p-doped MOSFET (PMOS) is formed in the second device region 104. Shallow trench isolation (STI) structures 110 are formed within the substrate 101 to isolate the NMOS and PMOS devices from each other and also from other adjacent devices formed within the substrate. The STI structures may comprise a trench etched in the substrate with a liner layer 112 formed along the sidewalls and bottom of the trench and a trench fill material 114 filling the rest of the trench. Alternatively, other isolation structures such as field oxide isolation structures may also be used for this purpose.

The NMOS device comprises a p-well 106 formed within a semiconducting portion of the substrate and a gate electrode 122 formed above the surface of the substrate. A gate dielectric 120 separates the gate electrode from the surface of the substrate. First sidewall spacers 124 abut both vertical sidewalls of the gate dielectric and gate electrode stack, while second sidewall spacers 126 abut the outer sidewalls of the first spacers 124. At this stage of the manufacturing process, n-type source drain extension (NSDE) 130 regions substantially aligned to the outer edges of the first spacers 124 and n-type source drain (NSD) regions 132 substantially aligned to the outer edges of the second spacers 126 have been formed within the substrate on opposed sides of the gate electrode 122. The NMOS also includes a channel region 134 located below the gate dielectric 120 between the NSDE regions 130. In one embodiment, the NSDE and NSD regions (130, 132) are formed by implantation of n-type dopants such as Phosphorus, Arsenic or compounds thereof. A higher dose is typically used for the formation of NSD regions 132 and the dopants used for the two implant processes may be the same or different.

At least a surface portion of the NSD region 132 extending from the surface of the substrate 101 is in an amorphous state. The depth and degree of amorphization being chosen so as to facilitate the memorization of stress transmitted from a subsequently deposited stressor layer to the NMOS device. In general, the amount of stress memorization increases with the depth of the amorphous region but there is also a need to avoid dopant punchthrough and mitigate substrate damage caused by any amorphization implant.

The substrate in the NSD regions 132 may be transformed from a crystalline to amorphous state by implanting atoms such as Ge, Si, or inert gases like Ne, Ar, Kr into the targeted region. In one embodiment, the amorphization implant is carried out separately from the NSDE and NSD implant processes. It may take the form of an intermediate pre-amorphization implant step that is performed after the formation of the second spacers 126 and before implantation of N+ source/drain dopants. In another embodiment, the process of implanting NSDE and/or NSD dopants into the substrate may be capable of creating a degree of amorphization that is sufficient for the efficient transmission of stress from the above mentioned stress layer to the NMOS channel 134.

The PMOS device in FIG. 1 comprises an n-well 108 formed within a semiconducting portion of the second device region 104 and a gate electrode 142 formed above the surface of the substrate. A gate dielectric 140 separates the gate electrode from the surface of the substrate. Third sidewall spacers 144 abut both vertical sidewalls of the PMOS gate dielectric and gate electrode stack, while fourth sidewall spacers 146 abut the outer sidewalls of the third spacers 144. At this stage of the manufacturing process, p-type source drain extension (PSDE) 150 regions substantially aligned to the outer edges of the third spacers 144 and p-type source drain (PSD) regions 152 substantially aligned to the outer edges of the fourth spacers 146 have been formed within the substrate on opposed sides of the gate electrode 142. The PMOS also includes a channel region 154 located in the substrate region below the gate dielectric 140. In one embodiment, the PSDE and PSD regions (150, 152) are formed by implantation of p-type dopants such as Boron, Aluminum, Gallium, Indium or compounds thereof. A higher dose is typically used for the formation of PSD regions 152 and the dopants used for the two implant processes may be the same or different.

Each of the foregoing gate dielectric layer, gate electrode layer and spacers may be formed in a manner generally conventional in the semiconductor fabrication art. For example, the gate dielectric layer may comprise a dielectric material such as but not limited to silicon dioxide, silicon oxynitride, silicon nitride, a high-K metal oxide or a combination thereof. The gate dielectric may also be deposited using methods such as thermal oxidation, chemical vapor deposition, rapid thermal oxidation or the like. As for the gate electrode, it may comprise a conductive or semi-conductive material. Non-limiting examples include doped polysilicon, a metal silicide or a combination thereof. In one embodiment, the first and third spacers (124, 144) may comprise silicon oxide and the second and fourth spacers silicon nitride. Alternatively, other material compositions may also be used for the spacers depending on design and performance requirements and the number of sidewall spacers may also vary from that illustrated in FIG. 1. In one embodiment, the first and third spacers are formed by thermal oxidation while the second and fourth spacers are formed by the blanket deposition of a second spacer layer e.g. by chemical vapor deposition followed by an anisotropic etch process to remove lateral portions thereof. Alternatively, the spacers may also be formed by other methods.

Figure 2:
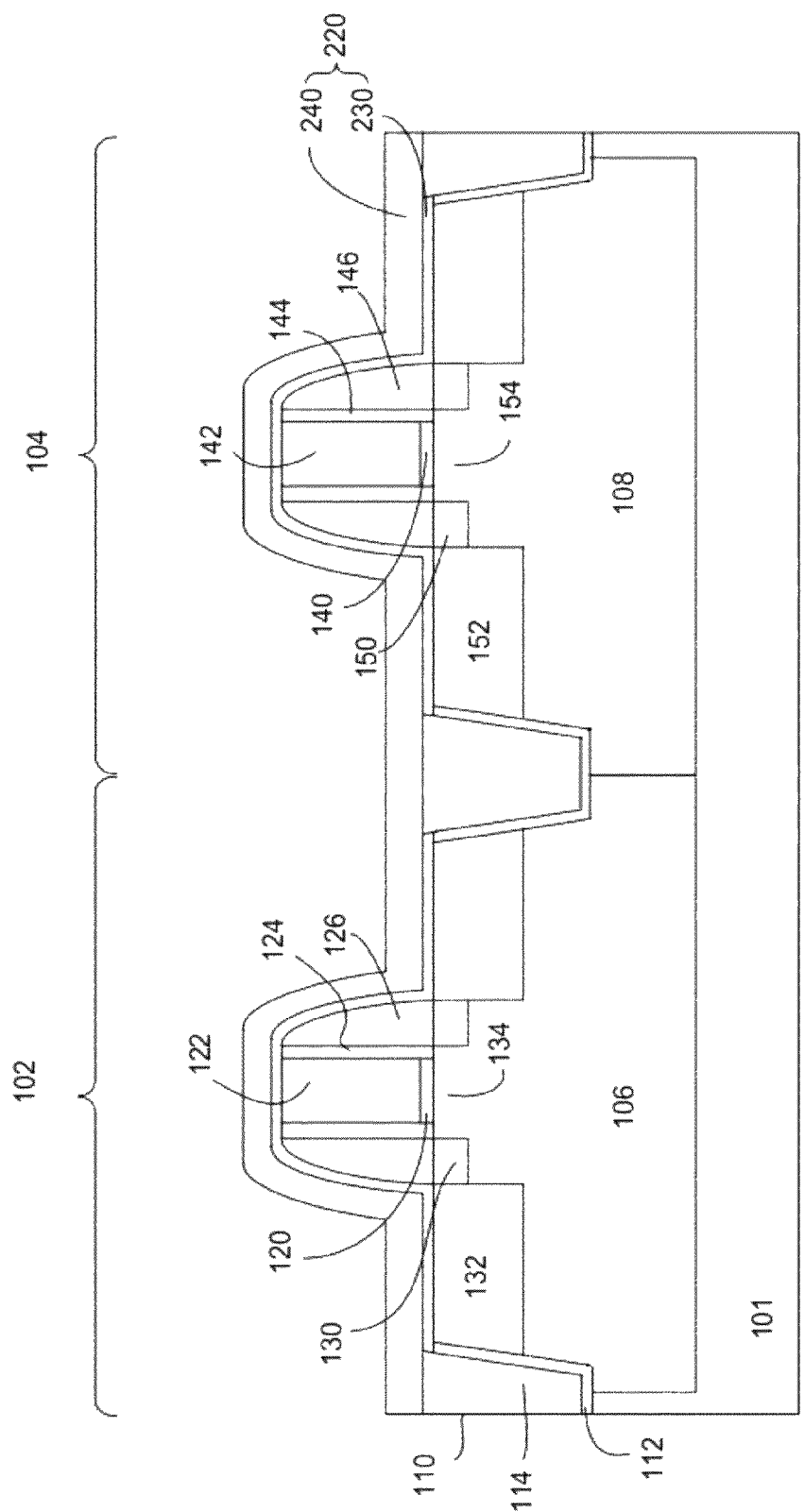

Referring now to FIG. 2, therein is shown the semiconductor structure 10 of FIG. 1 after the formation of a conformal stressor layer 220 that extends across the NMOS and PMOS device regions (102,104). The stressor layer 220 covers the source/drain, gate electrode and sidewall spacers of both devices. In the presently described embodiment, the stressor layer 220 exhibits a net tensile stress. The magnitude of stress is selected so that a resultant tensile stress that enhances the mobility of carriers in the NMOS channel can eventually be provided in the NMOS channel. The stressor layer 220 comprises a liner layer 230 and a first stress layer 240. Preferably, the liner layer 230 is formed of a material that can act as an etch stop layer during a subsequent etch process for removing the first stress layer 240. In one embodiment, the liner layer 230 is a silicon oxynitride (SiON) or silicon carbide (SiC) layer while the first stress layer 240 is a high tensile stress silicon nitride layer. Alternatively, doped silicon or other combinations of materials may also be used for the first stress layer. The stressor layer may also consist of only a single layer or comprise more than two layers so long as it exhibits a net tensile stress with the aforementioned characteristics. In one embodiment, the net tensile stress of the stressor layer 220 may range from 0.5 GPa/cm$^2$ to 2 GPa/cm$^2$. Exemplary methods for forming the stressor layer 220 include, but are not limited to chemical vapor deposition (CVD), physical vapor deposition (PVD), atomic layer deposition (ALD), high density plasma deposition (HDP) or thermal oxidation or a combination thereof. In one embodiment, the process parameters associated with the formation of one or more layers in the stressor layer 220 may be tuned to provide a layer with a desired level of stress. Exemplary process parameters that can be tuned include one or more of deposition temperature, pressure, and ion bombardment during deposition.

Figure 3:
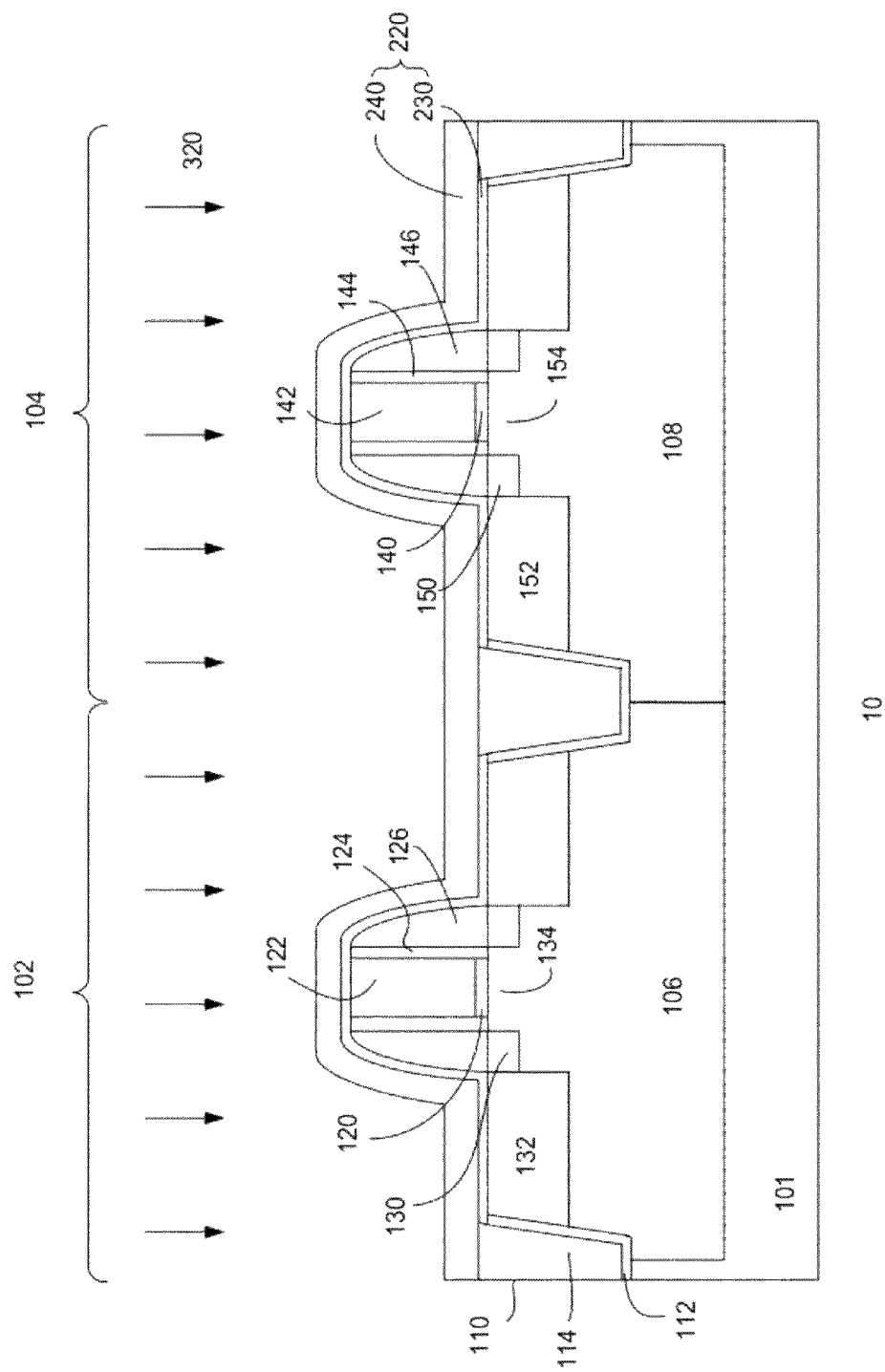

In FIG. 3 the semiconductor structure 10 is subjected to laser radiation during a laser stress memorization technique (SMT) anneal step. The laser SMT process is configured so that at least a portion of the tensile stress from the stressor layer 220 is transmitted to the underlying substrate and memorized in the form of a tensile stress along the lateral direction of the NMOS channel region 134. The tensile stress memorized in the NMOS as a result of the SMT anneal is more or less maintained even after the stressor layer 220 is subsequently removed and is of a value that is sufficient to enhance the mobility of electrons in the NMOS channel region 134. Without limiting ourselves to any particular theory, stress memorization may be caused by recrystallization of the NSD regions and portions of the gate electrode in the presence of the overlying stressor layer 220 during laser SMT anneal.

The laser SMT anneal conditions are also chosen so that the amorphized portions of the NSD regions are re-crystallized and substantial activation of the NSD dopants occurs during the SMT anneal. The laser SMT anneal may comprise the use of a gas laser source such as CO2/Argon-ion, or an excimer laser such as of ArF [193 nm], KrCl [222 nm], KrF [248 nm], XeCl [308 nm], and XeF [351 nm]). The duration of the laser SMT anneal may fall within the us-ns range with the laser source heating the substrate to a peak temperature of between 900° C. to 1400° C. The chuck temperature may range between 500° C. to 1000° C. It is to be appreciated that these parameters are not limiting and those skilled in the art will appreciate that the specific combination of parameters chosen will vary and additional parameters may also be employed/manipulated to effect the purpose of stress memorization and substantial dopant activation.

In general, the amount of stress transferred from a stressor layer to the channel of an NMOS tends increase with SMT anneal temperature. In this regard, laser SMT offers an advantage over other SMT anneal techniques such as lamp-based spike anneal because a laser source can achieve a peak temperature in excess of 1200° C. compared to a maximum temperature of between 1000 to 11150° C. for a lamp-based rapid thermal anneal source. Furthermore, laser anneal also has a lower thermal budget compared to other anneal sources such as rapid thermal anneal and lamp based anneals. The lower thermal budget allows for the use of high SMT anneal temperatures without incurring excessive junction outdiffusion.

Figure 4:
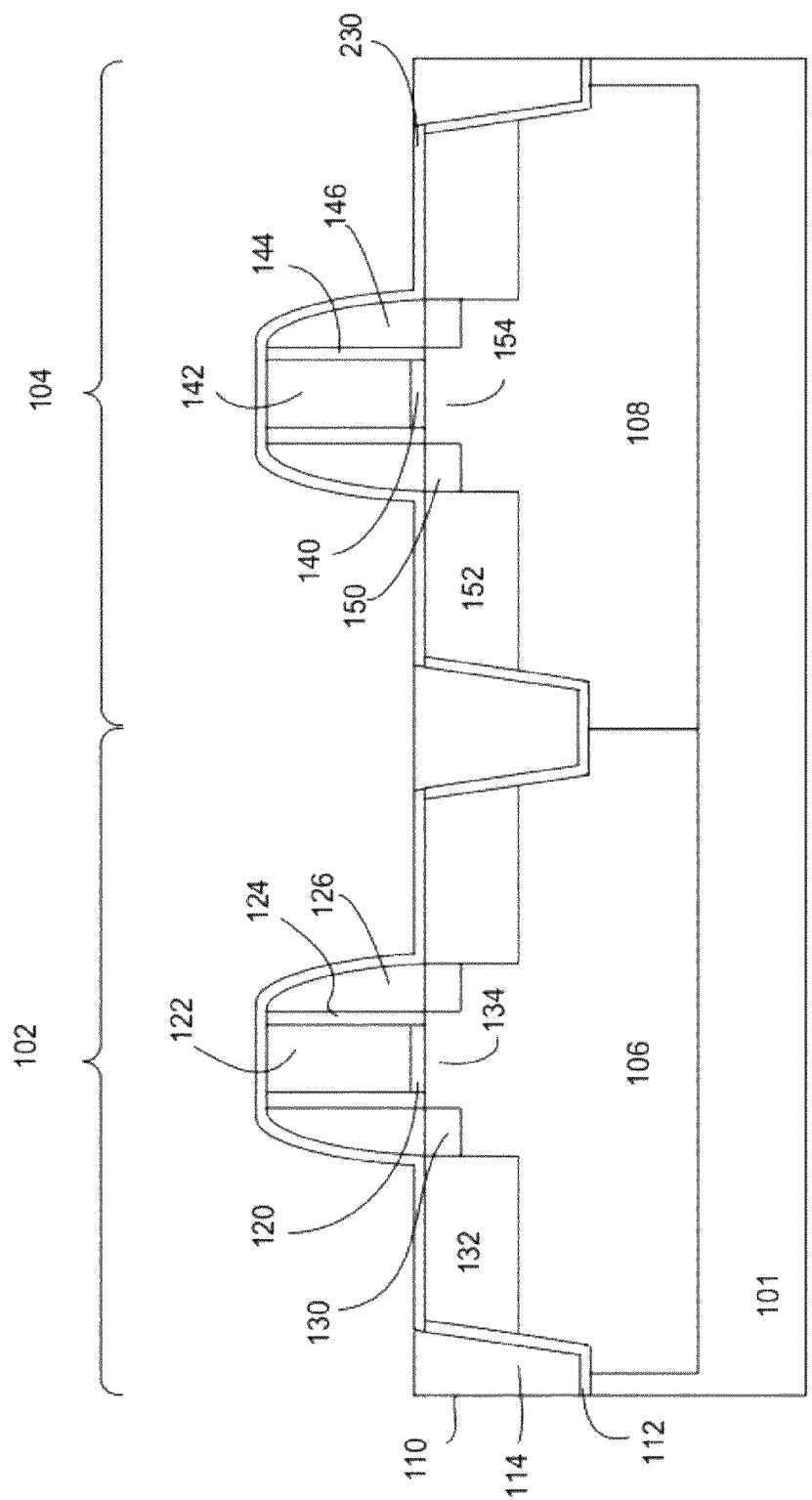
Figure 5:
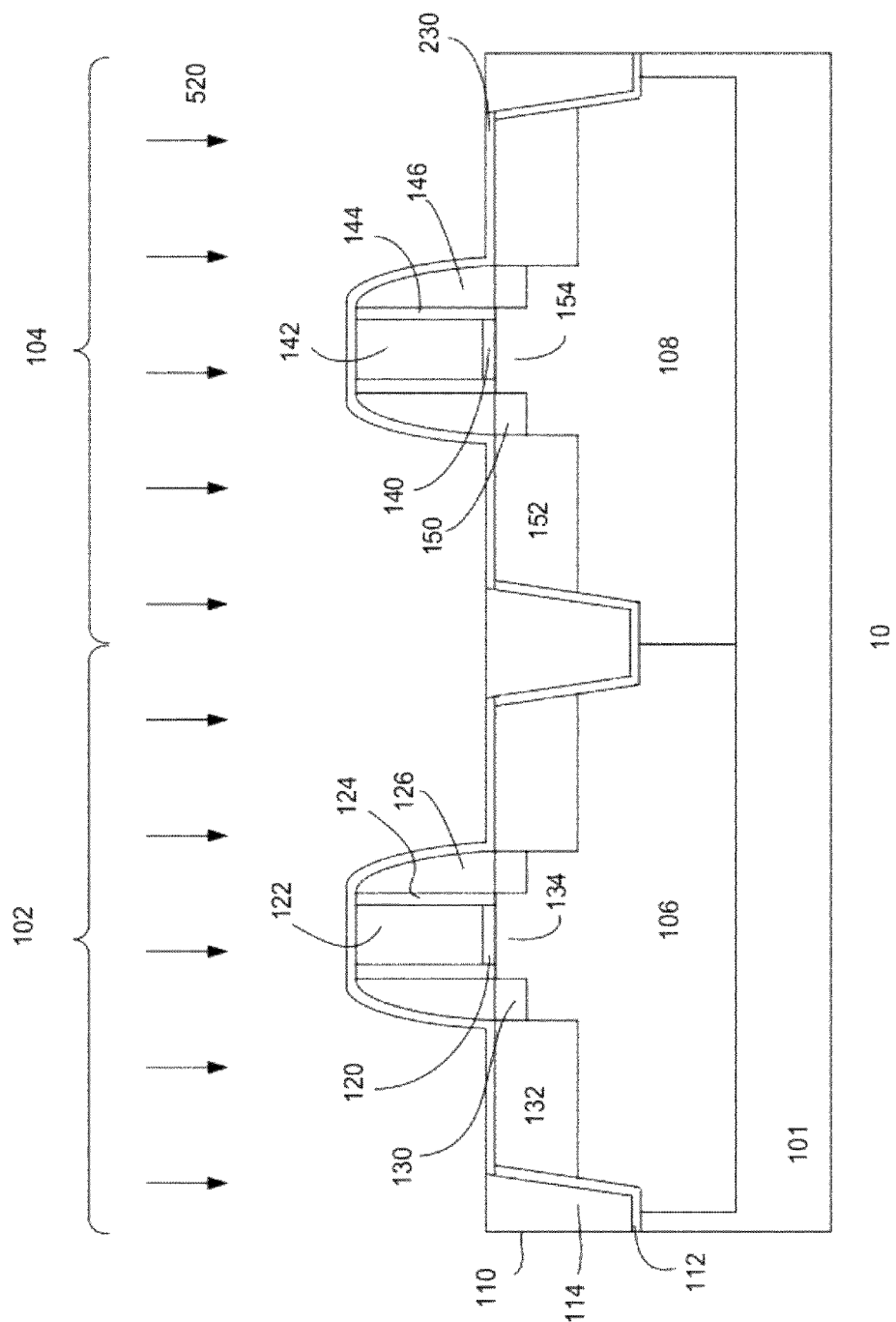

FIG. 4 shows the semiconductor structure 10 of FIG. 3 after completion of the laser SMT anneal and removal of the first stress layer 240. The first stress layer 240 may be removed using reactive ion etching or a wet etch process. Preferably, the liner layer 230 acts as an etch stop layer during the etch process for removing the first stress layer 240. In other embodiments, the first stress layer may also be retained. However, the inventors have found that removing the stress layer prior to the subsequent source/drain activation anneal tends to result in superior device performance.

Following the laser SMT anneal, a source/drain dopant activation anneal (as represented by arrows 520 in FIG. 5) is carried. The purpose of the source/drain anneal is not only to activate source/drain dopants in both the NSD and PSD regions (132, 152) but to effect a desired amount of outward diffusion for the NSD and PSD regions (132, 152) so that the two regions achieve a junction depth that is within a predetermined range where the device can operate with the desired performance. The source/drain dopant activation anneal preferably comprises lamp-based spike anneal and a laser anneal. In another embodiment, the source/drain activation anneal also consist of only a lamp-based spike anneal. The inclusion of the additional source/drain laser anneal helps to enhance dopant activation and lower source/drain series resistance and in certain instances may help to bring about superior device performance compared to a process consisting only of the lamp-based spike anneal.

Figure 6:
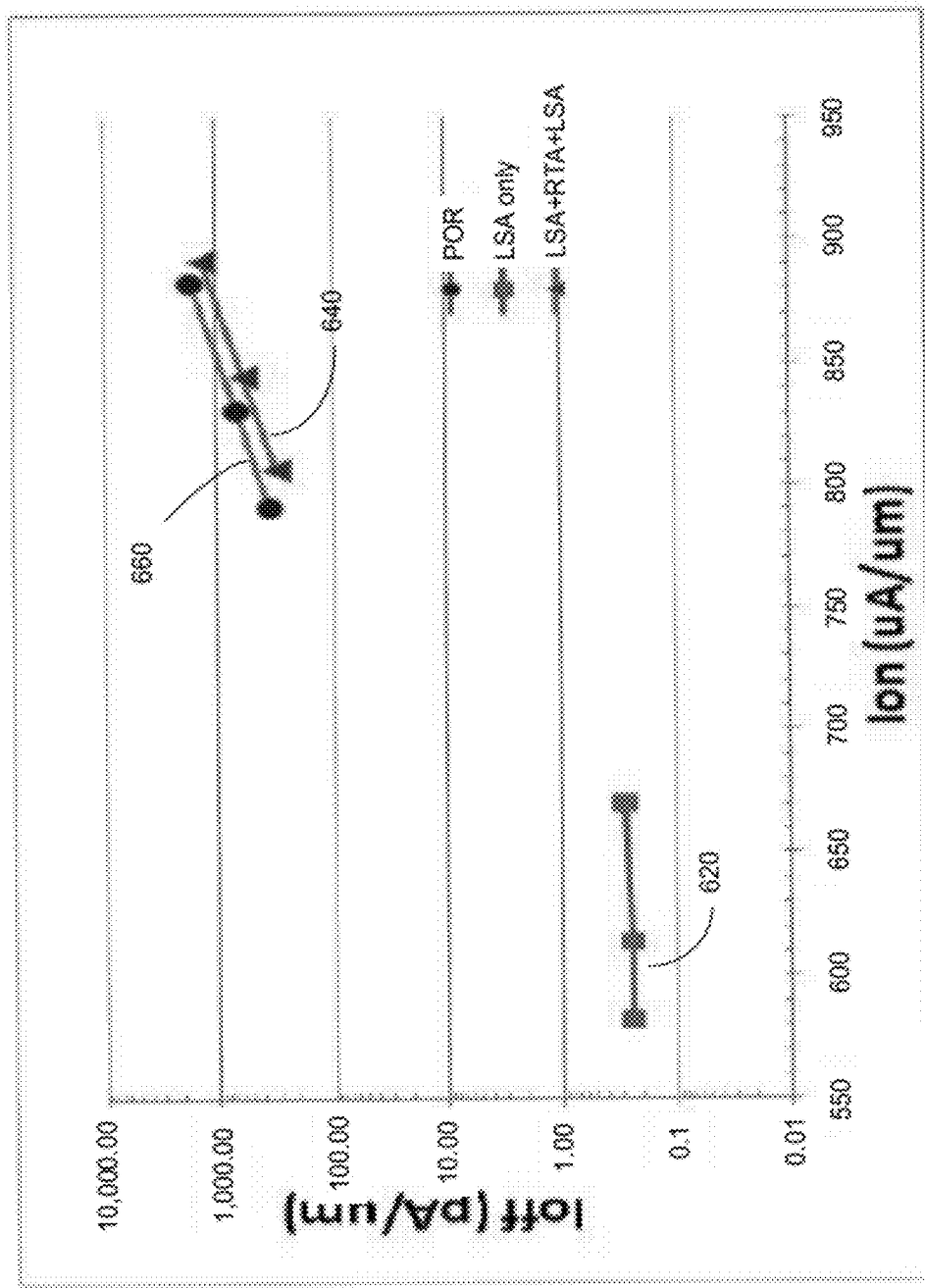
FIG. 6 is a graph showing the $I_{off}$ versus $I_{on}$ characteristics for a first transistor that is subjected to a laser process that combines SMT anneal and source/drain dopant activation and a second transistor where laser SMT and source/drain dopant activation is carried out separately.

FIG. 6 is a graph showing the $I_{off}$ versus $I_{on}$ characteristics (620, 640, 660) for three exemplary NMOS transistors with similar physical dimensions but subjected to different SMT and source/drain anneal processes. The first NMOS transistor 620 was subjected to a laser process that combines both SMT and source/drain activation. The second NMOS 640 was subjected to a laser SMT process and a separate source/drain anneal process. The source/drain anneal for the second NMOS 640 comprised of a lamp-based spike anneal and a laser anneal configured to provide for source/drain dopant activation and outward diffusion of the NSD and PSD regions so that the associated junction depth is within a predetermined range. The source/drain laser anneal for the second transistor does not form part of the laser SMT process but is a separate step performed after the laser SMT process. As for the third NMOS 660, the SMT and source/drain anneal are integrated into a single lamp based spike anneal. Apart from the aforementioned SMT and source/drain anneal processes the three NMOS transistors were processed in a similar manner. As evident from FIG. 6, the second NMOS 640 has a higher $I_{on}$ compared to the third NMOS for the same given $I_{off}$. The first NMOS 620, on the other hand, exhibits completely different $I_{off}$ versus $I_{on}$ characteristics. Therefore, subjecting the transistor to a laser anneal and separate source/drain activation anneal 640 advantageously results in superior performance compared to when the SMT and source/drain activation is integrated into a single lamp based spike anneal process.

It will be appreciated by those skilled in the art that after the source/drain activation anneal, additional conventional steps such as silicide contact formation, interconnect formation etc. can be performed as desired for the formation of an NMOS and PMOS transistor.

Figure 7:
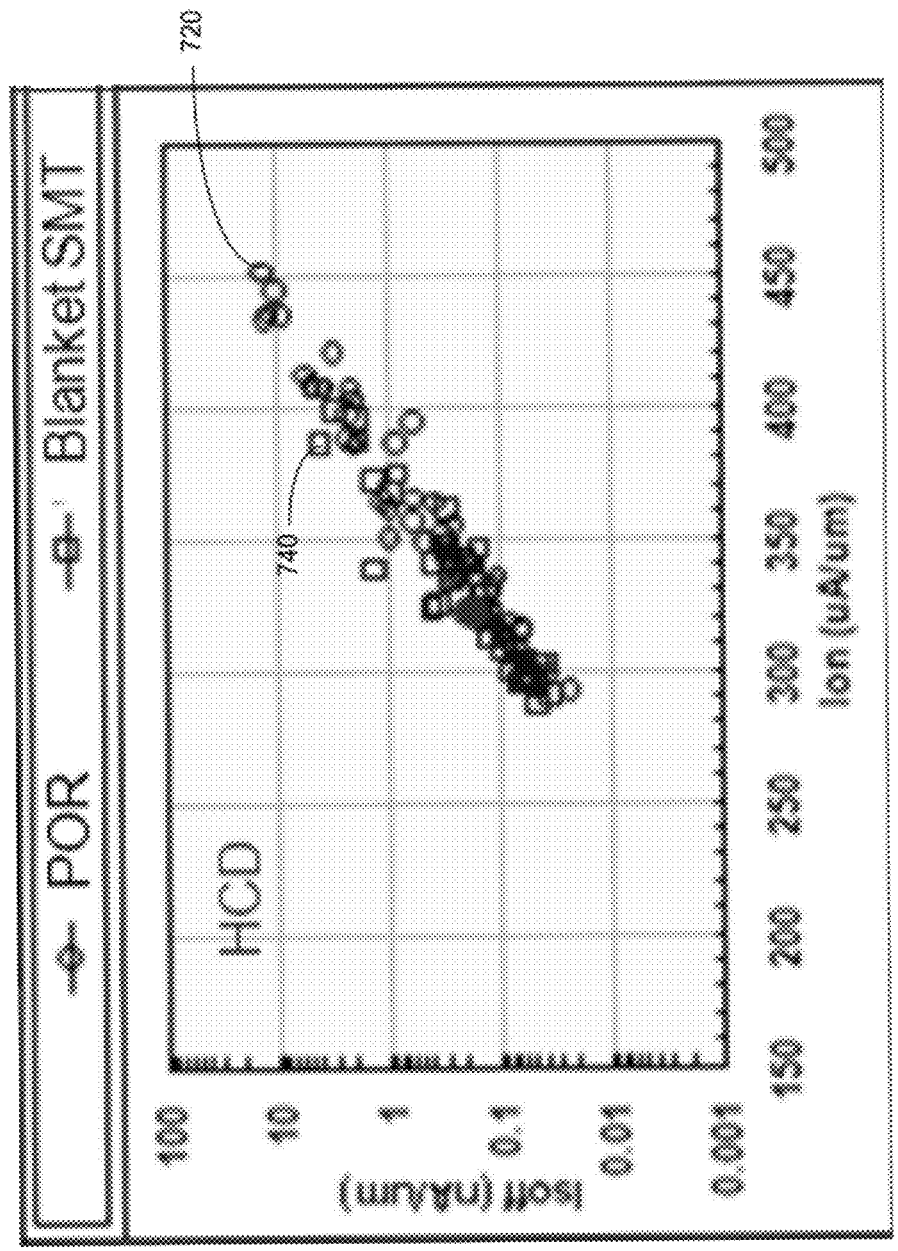
FIG. 7 is a graph showing the $I_{off}$ versus $I_{on}$ characteristics for two PMOS transistors processed in accordance with one embodiment of the invention.

In one embodiment (not shown), portions of the stressor layer 220 overlying the PMOS device may be selectively removed before commencing the laser SMT anneal shown in FIG. 3. This is to prevent the transfer of tensile stress from the stressor layer 220 to the PMOS. It is known that tensile stress leads to a decrease in hole mobility and as such PMOS drive current. However, the inventors have discovered that by performing a laser SMT and followed by a source/drain activation anneal that is configured to activate source/drain dopants and effect a desired amount of outward diffusion for the NSD and PSD regions, removal of stressor layer portions overlying the PMOS may no longer be necessary. Specifically, the inventors have observed that a PMOS processed in the above manner shows insignificant performance degradation even with an overlying tensile stressor layer during laser SMT anneal. The results of one such embodiment is shown in FIG. 7 which contains the $I_{off}$ versus $I_{on}$ characteristics for a first PMOS transistor 720 that is processed with no stressor layer overlying it during laser SMT anneal and a second PMOS transistor 740 that is processed with a tensile stressor layer present during laser SMT anneal. Apart from the above mentioned differences, the first and second transistors were processed in a similar manner including a source/drain activation anneal comprising a lamp-based spike anneal and a laser anneal. As evident from FIG. 7, the $I_{off}$ versus $I_{on}$ curves (720, 740) for the first and second transistors are substantially matched, thereby demonstrating that it is possible to retain the tensile stressor layer over the PMOS during laser SMT anneal without resulting in significant PMOS performance degradation.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A method for fabricating a semiconductor device comprising:
    providing a substrate comprising a first device region;
    forming a first device in the first device region, the first device comprising first diffusion regions;
    forming a stressor layer covering the substrate in the first device region and the first device, the stressor layer having a first stress value;
    performing a laser anneal to memorize at least a portion of the first stress value in the first device; and
    performing an activation anneal after the laser anneal to activate dopants in the first diffusion regions.

2. The method of claim 1 further comprising removing the stressor layer after performing the laser anneal and before performing the activation anneal.

3. The method of claim 2, wherein the activation anneal comprises a spike anneal.

4. The method of claim 3, wherein the activation anneal comprises a spike anneal and an activation laser anneal.

5. The method of claim 1, wherein the activation anneal causes the first diffusion regions to diffuse outward.

6. The method of claim 1 wherein the first device is a transistor of a first carrier type.

7. The method of claim 6 wherein the first device comprises a first gate electrode and the first diffusion regions are disposed within the substrate on opposed sides of the gate electrode.

8. The method of claim 7, further comprising amorphizing at least a portion of the first gate electrode and the substrate in the first device region before forming the stressor layer, wherein the laser anneal crystallizes amorphized portions of the first gate electrode and substrate.

9. The method of claim 1, wherein the substrate further comprises a second device region including a second device, the stressor layer covering the substrate in the second device region and the second device during the laser anneal.

10. The method of claim 9, wherein the first device is a transistor of a first carrier type and the second device is a transistor of a second opposite carrier type.

11. The method of claim 10, wherein the first device is an NMOS and the second device is a PMOS.

12. The method of claim 1, wherein the laser annealing step to memorize at least a portion of the first stress value is conducted at a temperature of.

* * * * *